(12) United States Patent
Uno et al.

(10) Patent No.: US 8,674,229 B2
(45) Date of Patent: Mar. 18, 2014

(54) ULTRA-THIN COPPER FOIL WITH CARRIER AND COPPER-CLAD LAMINATE BOARD OR PRINTED CIRCUIT BOARD SUBSTRATE

(75) Inventors: Takeo Uno, Tokyo (JP); Akira Kawakami, Tokyo (JP); Yuji Suzuki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 238 days.

(21) Appl. No.: 13/062,335

(22) PCT Filed: Sep. 4, 2009

(86) PCT No.: PCT/JP2009/065511
§ 371 (c)(1),
(2), (4) Date: May 19, 2011

(87) PCT Pub. No.: WO2010/027052
PCT Pub. Date: Mar. 11, 2010

(65) Prior Publication Data
US 2011/0209903 A1    Sep. 1, 2011

(30) Foreign Application Priority Data
Sep. 5, 2008    (JP) ................. 2008-227958

(51) Int. Cl.
H01B 1/04    (2006.01)
(52) U.S. Cl.
USPC ....................................... 174/126.2
(58) Field of Classification Search
USPC ............................. 174/126.2, 255
See application file for complete search history.

(56) References Cited

U.S. PATENT DOCUMENTS 4,568,413 A * 2/1986 Toth et al. .............. 156/151
5,114,543 A * 5/1992 Kajiwara et al. ........... 205/152
(Continued)

FOREIGN PATENT DOCUMENTS

JP    2001 301087    10/2001
JP    2002 368365    12/2002
(Continued)

OTHER PUBLICATIONS

International Search Report Issued Dec. 22, 2009 in PCT/JP09/065511 filed Sep. 4, 2009.

(Continued)

*Primary Examiner* — Chau Nguyen
(74) *Attorney, Agent, or Firm* — Oblon, Spivak, McClelland, Maier & Neustadt, L.L.P.

(57) ABSTRACT

The invention has as its object to provide an ultra-thin copper foil with a carrier which suppresses occurrence of blistering and is stable in peeling strength, in particular provides an ultra-thin copper foil with a carrier enabling easy peeling of a carrier foil from an ultra-thin copper foil even under a high temperature environment. As means for that, there is provided an ultra-thin copper foil with a carrier comprised of a carrier foil, a release layer, and a copper foil, wherein the release layer is formed by a first release layer disposed on the carrier foil side and a second release layer disposed on the ultra-thin copper foil side, there is a first interface between the carrier foil and the first release layer, a second interface between the ultra-thin copper foil and the second release layer, and a third interface between the first release layer and the second release layer, and the peeling strengths at the interfaces are first interface>third interface, and second interface>third interface.

15 Claims, 4 Drawing Sheets

(56) References Cited

U.S. PATENT DOCUMENTS

| | | | |
|---|---|---|---|
| 6,569,543 B2 | 5/2003 | Brenneman et al. | |
| 6,893,742 B2 | 5/2005 | Chen et al. | |
| 7,026,059 B2* | 4/2006 | Suzuki et al. | 428/626 |
| 7,049,007 B2* | 5/2006 | Gales et al. | 428/607 |
| 2002/0192486 A1* | 12/2002 | Chen et al. | 428/607 |
| 2004/0038049 A1 | 2/2004 | Suzuki et al. | |
| 2004/0121178 A1 | 6/2004 | Suzuki et al. | |
| 2005/0123782 A1 | 6/2005 | Chen et al. | |
| 2005/0249927 A1 | 11/2005 | Suzuki et al. | |
| 2006/0147802 A1* | 7/2006 | Yasuda et al. | 429/233 |
| 2007/0141381 A1 | 6/2007 | Suzuki et al. | |
| 2007/0154692 A1 | 7/2007 | Suzuki et al. | |

FOREIGN PATENT DOCUMENTS

| | | |
|---|---|---|
| JP | 2003 11267 | 1/2003 |
| JP | 2004 169181 | 6/2004 |
| JP | 2005 502496 | 1/2005 |
| JP | 2006-22406 A | 1/2006 |
| JP | 2007 186782 | 7/2007 |
| JP | 2008 130867 | 6/2008 |
| WO | 02 24444 | 3/2002 |
| WO | 2007 186781 | 7/2007 |

OTHER PUBLICATIONS

Office Action issued Oct. 12, 2012, in Korean Patent Application No. 10-2011-7007807 with English translation.

* cited by examiner

ULTRA-THIN COPPER FOIL WITH CARRIER AND COPPER-CLAD LAMINATE BOARD OR PRINTED CIRCUIT BOARD SUBSTRATE

TECHNICAL FIELD

The present invention relates to an ultra-thin copper foil with a carrier and to a printed circuit board substrate which uses the ultra-thin copper foil with a carrier, more particularly relates to an ultra-thin copper foil with a carrier suitable for use at a high temperature of 300° C. or more and to a circuit board using the ultra-thin copper foil.

BACKGROUND ART

Usually, a copper foil which is used for a printed circuit board substrate which forms the base of a printed circuit board, multilayer printed circuit board, chip-on-film-use circuit board, etc. is roughened at its surface on the side to be hot bonded to a resin substrate or the like. This roughened surface exhibits an anchoring effect for the substrate. This thereby raises the bond strength between the substrate and the copper foil to secure reliability as the printed circuit board substrate.

In recent years, in circuit boards, to deal with the high integration of various types of electronic parts, finer line widths and line spacing for interconnect patterns have been increasingly requested. For example, in a case of a printed circuit board used for a semiconductor package, it has been requested to provide a printed circuit board having high density ultra-fine interconnects with line widths and line spacing of approximately 30 µm, respectively.

When using a thick copper foil as such a copper foil for a fine pattern printed circuit board, an etching time to form interconnect circuits by etching becomes longer. As a result, the verticality of the side walls of the interconnect patterns formed is ruined. When the interconnect line widths of the interconnect patterns formed are narrow, this sometimes leads to disconnects. Accordingly, as the copper foil used for fine pattern applications, a copper foil having a thickness of 9 µm or less is demanded. At present, a copper foil having a thickness of 5 µm or less is being frequently used.

However, such 9 µm or less thin copper foil (hereinafter, sometimes referred to as an "ultra-thin copper foil") is weak in mechanical strength, easily suffers from wrinkles or creases at the time of production of the printed circuit board substrate, and sometimes causes tearing of the copper foil. Therefore, as the ultra-thin copper foil used for fine pattern applications, an ultra-thin copper foil with a carrier obtained by directly electrodepositing an ultra-thin copper foil layer on one surface of a carrier comprised of a metal foil (hereinafter, referred to as a "carrier foil") through a release layer is being used. The copper foil of a thickness of 5 µm or less used at present and explained above is provided as this ultra-thin copper foil with a carrier.

An ultra-thin copper foil with a carrier is comprised of a carrier foil on one surface of which a release layer and an ultra-thin copper foil formed by electroplating of copper are formed in that order. The surface of the outermost layer of the ultra-thin copper foil formed by the electroplating of copper is finished to a roughened surface. Then, the roughened surface is superposed on a resin base material, then the entire assembly is hot bonded, then the carrier foil is peeled off to thereby form a copper-clad laminate board. Predetermined interconnect patterns are formed on the ultra-thin copper foil at the surface of the copper-clad laminate board in this mode of use.

When peeling off of the carrier foil after hot bonding the ultra-thin copper foil to the resin base material, the problem arises of deformation of the ultra-thin copper foil if the ultra-thin copper foil has a thickness less than 5 µm. Therefore, it has been considered necessary to make a peeling strength when peeling off the carrier foil and the ultra-thin copper foil (hereinafter, sometimes referred to as a "carrier peel") low and stable.

A carrier foil functions as a reinforcing material for stably maintaining the shape of the ultra-thin copper foil until bonding the ultra-thin copper foil to the resin base material. The release layer is a layer for improving the peeling when separating the ultra-thin copper foil from the carrier foil. By removal together with the carrier foil, the carrier foil can be cleanly and easily peeled off.

The copper-clad laminate board comprised of the resin base material with the ultra-thin copper foil bonded to it is then successively formed with through holes and plating at the through holes. Then, the ultra-thin copper foil at the surface of the copper-clad laminate board is etched to form interconnect patterns provided with desired line widths and desired line spacing. Finally, a solder resist is formed and other finishing work is performed.

For the release layer formed on the carrier foil, conventionally use has been made of benzotriazole or another organic system, a metal oxide or another inorganic system, a solo metal element, alloy, or other metal system, and so on. However, in a circuit board substrate using a polyimide or other highly heat resistant resin as the resin base material, a heating temperatures when pressing the copper foil and a resin and curing the resin becomes high. This cannot be handled by an organic-based release layer where peeling becomes difficult due to a rise of the peeling strength caused by this heat treatment, so a metal-based release layer is mainly being used.

As the metal of forming a metal-based release layer, Cr (PLT 1), Ni (PLTs 1 and 2), Ti (PLT 3), and so on have been proposed up to now.

These proposals have as characteristic features rendering part of the metal forming the release layer into an oxide state adjusting the carrier peel according to a ratio of content between the metal and the oxides in the release layer and the thickness of the oxide coating film formed at the surface of the metal. However, due to differences of the ratio of the oxide content and thickness of the oxide coating film, there were the problems that variations easily arose in the carrier peel, the carrier peel was hard to stabilize, and blistering occurred.

Further, at the surface of oxides, precipitation by electroplating of copper is hard to occur, so it is difficult to uniformly plate the release layer. Therefore, sometimes there also arise the problems of variation of thickness of the ultra-thin copper foil and occurrence of pinholes.

Contrary to this, it has been proposed to continuously change an oxygen concentration inside a release layer in a release layer made using a plurality of metals and oxides of the same so as not to form a clear interface and thereby to prevent blistering which occurs due to a difference of thermal expansion coefficient etc. at an interface (PLT 4). However, since the interface at which peeling is liable to occur does not become constant, the problem of the carrier peel becoming higher and harder to stabilize could not be solved.

FIG. 3 schematically shows a carrier peel of a conventional copper foil with a carrier, in which 1 indicates an ultra-thin copper foil, 2 a carrier foil, 8 a release layer, 9 the position where blistering occurred, and dotted lines indicate portions where the peeling strength is weak. FIG. 3A shows a state where blistering occurred due to existence of a portion having a weak adhesion between the ultra-thin copper foil and the release layer, FIG. 3B shows a state where the carrier peel has variation, there are parts where peeling is difficult, and the carrier peel becomes high, while FIG. 3C shows a state where the carrier peel has variation, so the carrier peel does not become stable.

As one means for solving these problems, the present applicant previously developed an ultra-thin copper foil with a carrier suppressing occurrence of blistering, exerting no influence upon a carrier peel, stable in production quality, and easily capable of peeling apart the carrier foil and electrolytic copper foil even under a high temperature environment (PLTs 5 and 6).

CITATION LIST

Patent Literature

PLT 1: Japanese Patent Publication (A) No. 2001-301087
PLT 2: Japanese Patent Publication (A) No. 2002-368365
PLT 3: Japanese Patent Publication (A) No. 2003-11267
PLT 4: Japanese Patent Publication (A) No. 2008-130867
PLT 5: Japanese Patent Publication (A) No. 2007-186781
PLT 6: Japanese Patent Publication (A) No. 2007-186782

SUMMARY OF INVENTION

Technical Problem

However, the ultra-thin copper foil with a carrier described above has never been sufficiently improved in the point that the interface at which peeling occurs does not become constant and carrier peels in a width direction and a longitudinal direction are hard to stabilize when peeling the carrier foil from the copper foil.

In consideration of such a problem, an object of the present invention is to provide an ultra-thin copper foil with a carrier which suppresses occurrence of blistering and has a peeling strength stabilized. Particularly, the object resides in the provision of an ultra-thin copper foil with a carrier enabling easily peeling of the carrier foil from the ultra-thin copper foil even when it is placed under a high temperature environment.

Further, another object of the present invention is to provide a copper-clad laminate board substrate or a printed circuit board substrate which forms the base material of a printed circuit board, multilayer printed circuit board, chip-on-film-use circuit board etc. for fine pattern applications using the ultra-thin copper foil with a carrier.

Solution to Problem

An ultra-thin copper foil with a carrier of the present invention is comprised of a carrier foil, a release layer, and a copper foil, wherein the release layer is formed by a first release layer disposed on the carrier foil side and a second release layer disposed on the ultra-thin copper foil side, there are a first interface between the carrier foil and the first release layer, a second interface between the ultra-thin copper foil and the second release layer, and a third interface between the first release layer and the second release layer, and the peeling strengths at the interfaces are as follows:

first interface>third interface and
second interface>third interface.

In the above ultra-thin copper foil with a carrier, the release layer is formed by a metal A retaining a peeling property and a metal B facilitating plating of the ultra-thin copper foil, and an element ratio x of the metal A and an element ratio y of the metal B at the peeling surface on the ultra-thin copper foil side when peeling the carrier foil from the ultra-thin copper foil have a ratio of:

$$10 \leq \{(y/(x+y)\} \times 100 \leq 80$$

In the above ultra-thin copper foil with a carrier, when the thicknesses of the release layers remaining at the peeling surfaces on the carrier foil side and on the ultra-thin copper foil side when peeling the carrier foil from the ultra-thin copper foil are d1 and d2, the following stands:

$$0.5 \leq d1/d2 \leq 12$$

The third interface is preferably an oxide layer obtained by applying an oxidation treatment to the surface of the first release layer.

Preferably, the metal A forming the release layer is selected from a group comprising Mo, Ta, V, Mn, W, and Cr, and the metal B is selected from a group comprising Fe, Co, and Ni.

Preferably, a sum of metal deposition amounts of the release layer is 0.05 mg/dm$^2$ to 50 mg/dm$^2$.

A printed circuit board substrate of the present invention is a copper-clad laminate board or a printed circuit board substrate which is formed by a laminate of an ultra-thin copper foil of an ultra-thin copper foil with a carrier on a resin substrate and which is particularly excellent for high density ultra-fine interconnect applications.

Advantageous Effects of Invention

The present invention can provide an ultra-thin copper foil with a carrier which is stable in carrier peel, is resistant to blistering, and enables easy peeling of the carrier foil from the ultra-thin copper foil even under a high temperature environment.

Further, the present invention can provide a copper-clad laminate board substrate or printed circuit board substrate which becomes the base of a printed circuit board, multilayer printed circuit board, chip-on-film-use circuit board etc. for fine pattern applications using the ultra-thin copper foil with a carrier.

DESCRIPTION OF EMBODIMENTS

As a metal carrier foil for the ultra-thin copper foil with a carrier, in general, use can be made of aluminum foil, aluminum alloy foil, stainless steel foil, titanium foil, titanium alloy foil, copper foil, copper alloy foil, etc. However, as the carrier foil used for the ultra-thin copper foil or ultra-thin copper alloy foil (hereinafter referred to overall as an "ultra-thin copper foil" when there is no need for differentiating them), in view of convenience of handling thereof, an electrolytic copper foil, electrolytic copper alloy foil, rolled copper foil, or rolled copper alloy foil is preferred. Further, preferably a foil having a thickness of 7 µm to 200 µm is used.

When a thin copper foil having a thickness of less than 7 µm is employed as the carrier foil, the mechanical strength of this carrier foil is weak, therefore there are risks that wrinkles and crease will easily occur at the time of production of the printed circuit board substrate etc. and tearing of the foil will be caused. Further, when the thickness of the carrier foil becomes more than 200 µm, the weight per unit coil (coil unit weight) increases thereby exerting a great influence upon the productivity and requiring larger tension at the equipment as well, so the equipment becomes larger in size. This is not preferred. Accordingly, the thickness of the carrier foil is preferably 7 µm to 200 µm.

As the carrier foil, preferably use is made of a metal foil having a surface roughness Rz of 0.01 µm to 5.0 µm on at least one surface. Particularly, when visibility etc. on the chip-on-film-use circuit board are demanded, the Rz is preferably 0.01 µm to 2.0 µm. For this reason, when a carrier foil having a surface roughness Rz within a range of from 2 µm to 5.0 µm is used in the case when visibility for the chip-on-film-use circuit board etc. are demanded, a rough surface may be mechanically ground or electrolytically ground in advance to thereby to smooth it so that the surface roughness Rz becomes within a range of from 0.01 µm to 2 µm in use. Note that, it is also possible to apply mechanical grinding/electrochemical dissolution to a carrier foil having a surface roughness Rz of 5 µm or more in advance so as to smooth it for use.

In the present invention, the release layer is comprised of a metal and a non-metal or metal oxide or alloy in a mixture. Particularly the release layer of the present invention is comprised of a metal A for retaining the peeling property and a metal B for facilitating the plating of the ultra-thin copper foil.

The metal A forming the release layer is selected from a group comprising Mo, Ta, V, Mn, W, and Cr. Further, the metal B is selected from a group comprising Fe, Co, and Ni.

Figure 1:
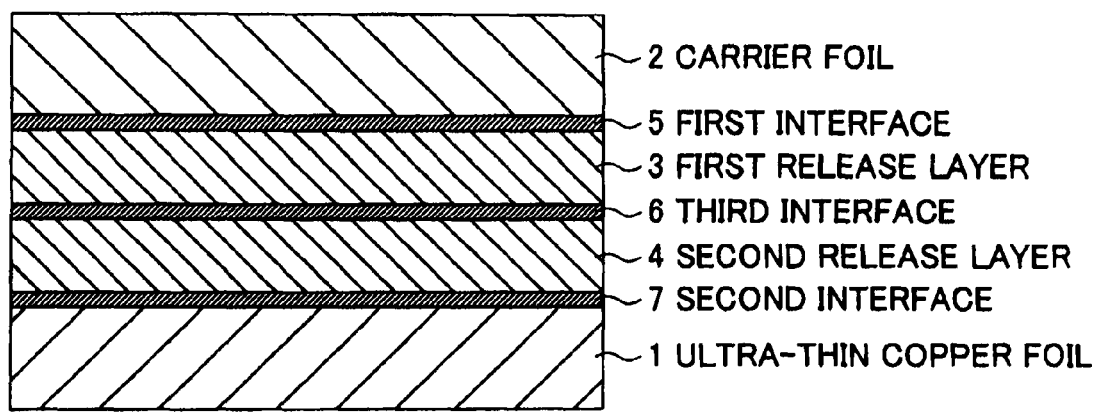
[FIG. 1] A cross-sectional view schematically showing an embodiment of the present invention.

The release layer is configured by, as schematically shown in FIG. 1, a first release layer 3 disposed on the carrier foil 2 side and a second release layer 4 disposed on an ultra-thin copper foil 1 side. Further, there is a first interface 5 between the carrier foil 2 and the first release layer 3, a second interface 7 between the ultra-thin copper foil 1 and the second release layer 4, and a third interface 6 between the first release layer 3 and the second release layer 4.

Figure 2:
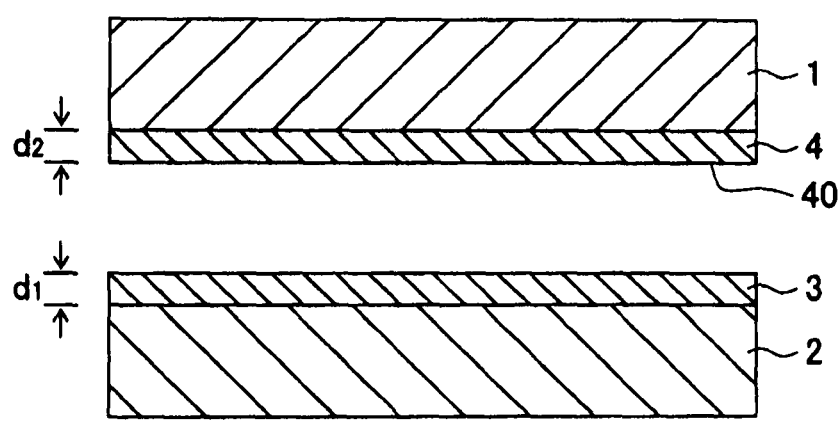
[FIG. 2] An explanatory diagram schematically showing a state where a carrier foil and an ultra-thin copper foil of the ultra-thin copper foil with a carrier shown in FIG. 1 are separated.
Figure 3A:
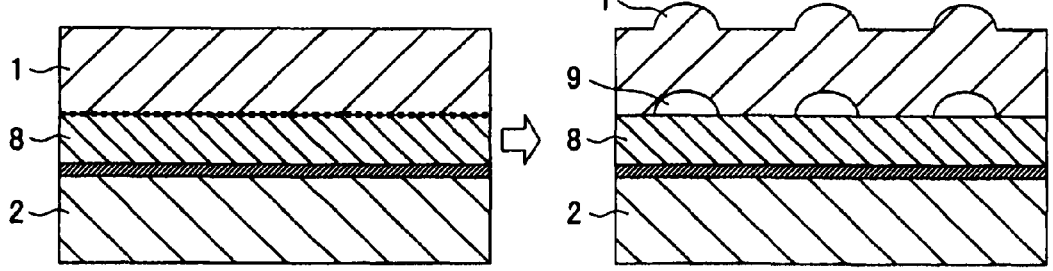
[FIG. 3] An explanatory diagram schematically showing a separation state of a carrier foil and a copper foil of a conventional copper foil with a carrier.
Figure 3B:
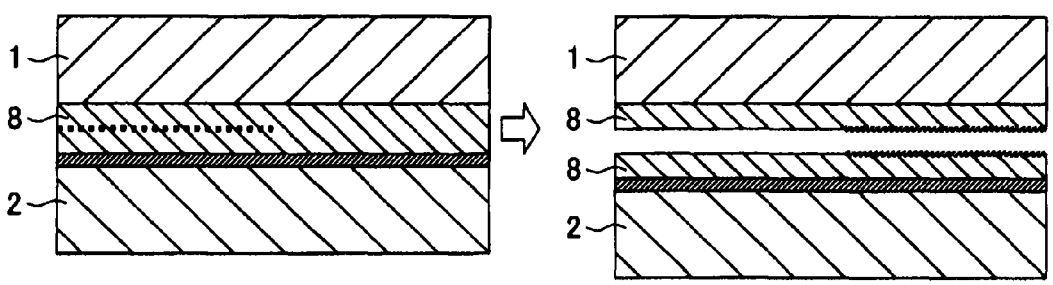
Figure 3C:
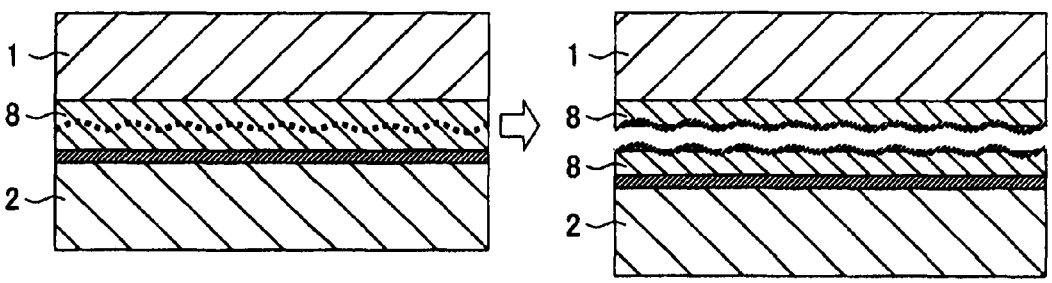

In the present invention, the metal A for retaining the peeling property and the metal B for facilitating plating of the ultra-thin copper foil are preferably given, as schematically shown in FIG. 2, the following ratio where the element ratio of the metal A at a peeling surface 40 on the ultra-thin copper foil 1 side when peeling the carrier foil 2 from the ultra-thin copper foil 1 is x, and the element ratio of the metal B is y:

$$10 \leq \{(y/(x+y)) \times 100 \leq 80(\%)$$

If the above ratio is less than 10%, the carrier peel is liable to become too low, blistering is liable to easily occur, and the release layer is liable to become hard to plate.

Further, if the ratio becomes larger than 80%, the carrier peel will become too high and the problem will arise of the ultra-thin copper foil no longer being able to be peeled off. This ratio is particularly preferably 20 to 60%. Note that, when two or more types of metal of the same element group as the metal A or metal B are contained, the element ratio obtained by adding the element ratios of metals of the same element group is used as the element ratio.

Further, as shown in FIG. 2, by peeling the carrier foil 2 from the ultra-thin copper foil 1 at the third interface 6, these can be extremely easily separated. When the thicknesses of the release layer 3 remaining on the carrier foil 2 side and the release layer 4 remaining at the peeling surface on the ultra-thin copper foil 1 side when separating the carrier foil 2 and the ultra-thin copper foil 1 are d1 and d2, preferably the ratio becomes:

$$0.5 \leq d1/d2 \leq 12$$

If the above ratio is larger than 12, the adhesion between the ultra-thin copper foil and the release layer becomes too low and blistering easily occurs. Further, if the ratio becomes less than 0.5, the release layer remaining at the surface of the ultra-thin copper foil becomes thick. Therefore, when forming circuits on the copper-clad laminate board formed by deposition of the ultra-thin copper foil, the problem arises of a poor etching property. This ratio is particular preferably 2 to 10.

The above release layers can be formed by electroplating as will be explained later. In order to change the metal compositions of the release layers, even without intentionally changing the composition of the electrolytic bath, the metal compositions of the release layers can be changed by changing the plating conditions, for example changing the current density. Further, naturally the metal compositions of the release layers can be changed by changing the composition of the electrolytic bath.

In the present invention, the peeling strength at the third interface between the first release layer and the second release layer is made low in comparison with either of the first interface and the second interface. The peeling strength of the third interface is made low and the peeling strengths of the first interface and the second interface are made high in this way for the purpose of peeling the ultra-thin copper foil from the carrier foil at the third interface, preventing occurrence of blistering at the first interface and second interface, and enabling stable peeling at the time of carrier peel.

As a method of forming the third interface between the first release layer and the second release layer, for example, a method of forming the release layers divided into two steps is preferable. Alternatively, use of techniques such as configuring the plating by two baths, performing the plating with an interval, changing the current density in the electroplating, and so on is a preferred method as well.

Further, after the formation of the first release layer, by applying oxidation treatment to the surface of the first release layer to form an oxide layer, then suitably thereafter forming a second release layer on the oxide layer, the adhesion at the third interface between the first release layer and the second release layer is lowered, and it becomes possible to cause a more stable peeling strength at the time of carrier peel, therefore the effects of the present invention can be raised more.

As the method of forming an oxide layer on the surface of the first release layer, use can be made of techniques such as dipping in a treatment solution containing hydrogen peroxide or another oxidizing chemical, anode electrolytic treatment, and raising the current density in the electroplating.

In the present invention, the amount of the release layer to be deposited is preferably:

0.05 mg/dm$^2$ to 50 mg/dm$^2$

If the deposition amount is less than 0.05 mg/dm$^2$, the result does not sufficiently function as the release layer, so this is not suitable. Further, even when it is more than 50 mg/dm$^2$, peeling is possible, but the type of the metal for forming the release layer is a metal with difficulty in plating. Therefore, when the thickness is increased, the smoothness is lost and variation is seen in the peeling force, the stability is lost, and blistering might be caused. Therefore, preferably the amount is not more than 50 mg/dm$^2$. Further, when considering the smoothness of the surface of the ultra-thin copper foil as well, preferably the upper limit is made 20 mg/dm$^2$ or less.

The ultra-thin copper foil is formed on the release layer by electroplating by using a copper sulfate bath, copper pyrophosphate bath, copper sulfamate bath, copper cyanide bath, or the like.

Note that, at the time of formation of the ultra-thin copper foil, according to the elements composing the release layer, a dipping time/current value in the plating solution, draining off of the plating solution in finishing of plating/washing by water, pH of the plating solution immediately after the metal plating, and so on determine the remaining state of the release layer, therefore it is necessary to select the type of the plating bath from the relationship with the elements composing the release layer.

Further, in the formation of an ultra-thin copper foil on the release layer, sometimes it is very difficult to perform uniform plating because of the peeling property of the release layer, a large number of pinholes are present in the ultra-thin copper foil, or blistering easily occurs. At the time of such plating conditions, by performing strike copper plating first, a high density underlayer plating having a good adhesion is formed while reducing the oxides of the metal A. By applying usual copper plating to the top of that, uniform plating can be applied to the top of the release layer, the number of pinholes formed in the ultra-thin copper foil is greatly decreased, and occurrence of blistering can be prevented.

The thickness of copper plating deposited by the above strike plating is preferably 0.01 μm to 0.5 μm. There are a variety of conditions for that according to the type of bath. However, preferably the current density is 0.1 A/dm$^2$ to 20 A/dm$^2$, and the plating time is 0.1 second or more. If the current density is less than 0.1 A/dm$^2$, it is difficult to uniformly plate the release layer. Further, if it is more than 20 A/dm$^2$, burning plating occurs in the strike plating making the metal concentration of the plating solution lean, and a uniform copper plating layer is not obtained, so this is not preferred. For the plating time, less than 0.1 second is too short to obtain a sufficient plating layer, so is not preferred.

It is necessary to make the copper plating layer formed on the release layer by the strike plating a thickness that does not spoil the peeling property of the release layer. Preferably it is set to 0.01 to 0.5 μm. After forming this strike plating layer, the copper plating is performed to a desired thickness to make an ultra-thin copper foil.

Further, when forming the second release layer, then forming an ultra-thin copper foil, thinly dissolving away the second release layer by etching and suitably thereafter applying copper plating is effective for preventing pinholes and blistering.

When not etching the second release layer, when the carrier foil having the second release layer is dipped in the plating bath for forming the ultra-thin copper foil, the oxides existing on the surface of the second release layer are dissolved away, so voids easily form at the second interface between the second release layer and the ultra-thin copper foil and plating of the ultra-thin copper foil is liable to be obstructed and the adhesion at the second interface to fall. In such case, pinholes and blistering easily occur.

On the other hand, if applying etching, oxides of the metal A and metal B existing at the surface of the second release layer are dissolved away, therefore normal plating is achieved at the surface after etching, and the adhesion at the second interface becomes good as well. As a result, pinholes and blistering are prevented.

In the present invention, in order to stabilize the heat resistance in relation to the peeling property of the release layer, it is effective to dispose a diffusion prevention layer between the first release layer and the carrier foil or between the second release layer and the ultra-thin copper foil. The diffusion prevention layer is preferably formed by Ni or Co or an alloy of those. Note that, formation by Cr or a Cr alloy is effective as well.

Note that, in order to obtain a stronger adhesion of the surface of the ultra-thin copper foil with an insulation substrate, the surface of the ultra-thin copper foil may be roughened to make the roughness Rz of the surface 0.2 to 3.0 μm. This is because roughening to a roughness of less than 0.2 μm does not exert affect the adhesion so much, so there is no meaning even when performing roughening, while a sufficient adhesion is obtained if the roughness is 3 μm, so roughening exceeding that is not needed.

Finally, Ni, Zn, Cr, or another metal effective for rust inhibition and heat resistance is deposited on the roughened surface. Further, in order to improve the peel strength, it is effective to coat silane.

EXAMPLES

Below, the present invention will be more specifically explained using examples.

The plating conditions of the examples are shown in Table 1.

TABLE 1

| | Plating Conditions | | | | |
|---|---|---|---|---|---|
| Plating type | Name of chemical | Concentration (g/L) | Current density (A/dm$^2$) | Temperature (° C.) | pH |
| Cu plating condition 1 | Cu$_2$P$_2$O$_7$•3H$_2$O<br>K$_4$P$_2$O$_7$ | 3 to 50<br>50 to 350 | 0.1 to 5 | 20 to 60 | 8 to 11 |
| Cu plating condition 2 | Cu$_2$P$_2$O$_7$•3H$_2$O<br>K$_4$P$_2$O$_7$<br>NH$_3$OH (28%) | 10 to 150<br>50 to 400<br>1 to 10 mL/L | 1 to 10 | 20 to 60 | 8 to 12 |
| Cu plating condition 3 | Copper sulfate (as Cu metal)<br>Sulfuric acid | 10 to 70<br><br><br>30 to 120 | 1 to 60 | 10 to 70 | 1 to 2 |
| Ni plating | Nickel sulfate (as Ni)<br>Boric acid | 1 to 120<br><br><br>10 to 50 | 1 to 60 | 10 to 70 | 3 to 5 |

TABLE 1-continued

| | | Plating Conditions | | | |
|---|---|---|---|---|---|
| Plating type | Name of chemical | Concentration (g/L) | Current density (A/dm$^2$) | Temperature (° C.) | pH |
| Mo—Co plating | Co amount | 0.1 to 20 | 0.1 to 60 | 10 to 70 | 3 to 5 |
| | Mo amount | 0.05 to 20 | | | |
| | Citric acid | 5 to 240 | | | |
| Mo—Ni plating | Ni sulfate hexahydrate | 10 to 100 | 0.5 to 15 | 10 to 50 | 8 to 11 |
| | Sodium molybdate dihydrate | 10 to 100 | | | |
| | Sodium citrate | 30 to 200 | | | |
| W—Ni plating | Ni sulfate hexahydrate | 10 to 100 | 0.5 to 15 | 30 to 90 | 7 to 8 |
| | Sodium tungstate dihydrate | 10 to 100 | | | |
| | Sodium citrate | 30 to 200 | | | |

Examples 1 to 8

Production of ultra-thin copper foils with carriers by carrier foil→Mo—Co plating (first release layer)→Mo—Co plating (second release layer)→copper strike plating→copper plating (ultra-thin copper foil).

A copper foil (thickness: 31 μm) having an Rz of 0.8 μm at one surface was used as the carrier foil. A first release layer was formed on the carrier foil by Mo—Co plating in a first plating bath under the <Mo—Co plating conditions> described in Table 1. After transfer from the first plating bath to the second plating bath, the second release layer was formed by the Mo—Co plating in the second plating bath. During the transfer from the first plating bath to the second plating bath, a third interface was formed on the surface of the first release layer. By suitably adjusting the formation time of this first release layer or second release layer, the release layers of Examples 1 to 8 were formed.

Then, onto this second release layer, copper strike plating was applied under the above <Copper plating condition 1> to a thickness of 0.2 μm, then copper plating was performed for the top of that under the above <Copper plating condition 3> to form an ultra-thin copper foil having a thickness of 3 μm to thereby to make an ultra-thin copper foil with a carrier.

Note that, the samples used for the various evaluations were plated with 0.5 mg/dm$^2$ of Ni, 0.05 mg/dm$^2$ of Zn, and 0.3 mg/dm$^2$ of Cr on the surfaces on the ultra-thin copper foil side, then were treated by a silane coupling agent as surface treatment.

Example 9

Except for dipping the sample into the following oxidizing treatment solution during the transfer from the first plating bath to the second plating bath, the same treatment was performed as in Examples 1 to 8 to obtain an ultra-thin copper foil with a carrier.
Sulfuric acid: 10 to 30 g/dm$^3$
Hydrogen peroxide solution: 30 to 60 g/dm$^3$
Bath temperature: 10 to 30° C.

Example 10

Except for forming a diffusion prevention layer by Ni plating on the top of the carrier foil under the <Ni plating condition> described in Table 1, the same treatment was performed as in Examples 1 to 8 to obtain an ultra-thin copper foil with a carrier.

Examples 11 and 12

Except for forming the first release layer and second release layer by Mo—Ni plating and W—Ni plating under the <Mo—Ni plating condition> and <W—Ni plating condition> described in Table 1, the same treatment was performed as in Examples 1 to 8 to obtain ultra-thin copper foils with carriers.

Example 13

Except for forming the ultra-thin copper foil by a copper plating according to the above <Copper plating condition 2>, the same treatment was performed as in Examples 1 to 8 to obtain an ultra-thin copper foil with a carrier.

Conventional Example 1

Except for not forming the second release layer after forming the first release layer on the carrier foil by the Mo—Co plating, but applying copper strike plating, the same treatment was performed as in Examples 1 to 8 to obtain an ultra-thin copper foil with a carrier.

Comparative Examples 1 to 5

Except for making the formation time of the first release layer or second release layer during the transfer from the first plating bath to the second plating bath excessively long or short in comparison with Examples 1 to 8, the same treatment was performed as in Examples 1 to 8 to obtain ultra-thin copper foils with carriers.

<Evaluations>

Samples for evaluation of the carrier peel of the ultra-thin copper foils with carriers fabricated in the invention examples and comparative examples described above were prepared and evaluated as follows.

(1) Samples for Measurement of Carrier Peel and Confirmation of Blistering

Each of the ultra-thin copper foils with carriers (invention examples, conventional example, and comparative examples) was cut into a piece having a size of 250 mm long and 250 mm wide, then heated at a temperature of 350° C. for 10 minutes to thereby prepare a sample for confirmation of blistering.

Further, resin substrates were bonded by two-sided tapes to the ultra-thin copper foil sides of the above heat treated samples to obtain single-side copper-clad laminate boards with carrier foils polyimide for measurement of carrier peel.

Note that samples obtained by controlling the heating temperature to 300° C. and 400° C. were prepared as well for the evaluation of heat resistance.

(2) Pinhole Confirmation Samples

Each of the ultra-thin copper foils with carriers (invention examples, conventional example, and comparative examples) was cut into a piece having a size of 250 mm long and 250 mm wide, a transparent tape was adhered to the ultra-thin copper foil side, then the ultra-thin copper foil was peeled from the carrier foil to thereby prepare a sample for confirming pinholes.

<Evaluation of Characteristic of Ultra-Thin Copper Foils>

(1) Measurement Method of Carrier Peel and Confirmation of Blistering (a) Confirmation of Blistering Whether the ultra-thin copper foil on the carrier foil blistered was checked for by visual inspection. The number of blisters was counted. The results are shown in Table 4.

(b) Measurement of Carrier Peel

Using the carrier peel measurement use sample prepared as described above, according to the method prescribed in JIS C 6511, the ultra-thin copper foil was peeled off from the carrier foil with a measurement specimen width of 10 mm, and the carrier peel (peel strength) was measured with an n number 3. The evaluation results are shown in Table 4.

(c) Confirmation of Pinholes

Light was irradiated against the above sample for confirmation of pinholes from the bottom. The number of spots of light which were seen was counted and was defined as the number of pinholes. The measurement results are shown in Table 4.

(4) Evaluation of Heat Resistance

Using samples prepared by setting the heating condition to 300° C., 350° C., and 400° C. for 10 minutes in the fabrication of the above carrier peel measurement use sample, according to the method prescribed in JIS C 6511, the ultra-thin copper foil was peeled off from each carrier foil with a measurement specimen width of 10 mm, and the carrier peel (peel strength) was measured with an n number 3. The results of evaluation are shown in Table 5.

<Analysis of Peeling Surface when Peeling Carrier Foil From Ultra-Thin Copper Foil>

The carrier foil was peeled from the ultra-thin copper foil. The peeling surface of each of the carrier foil side and ultra-thin copper foil side was analyzed in a depth direction from the surface to the inside by using an AES analyzer.

Figure 4:
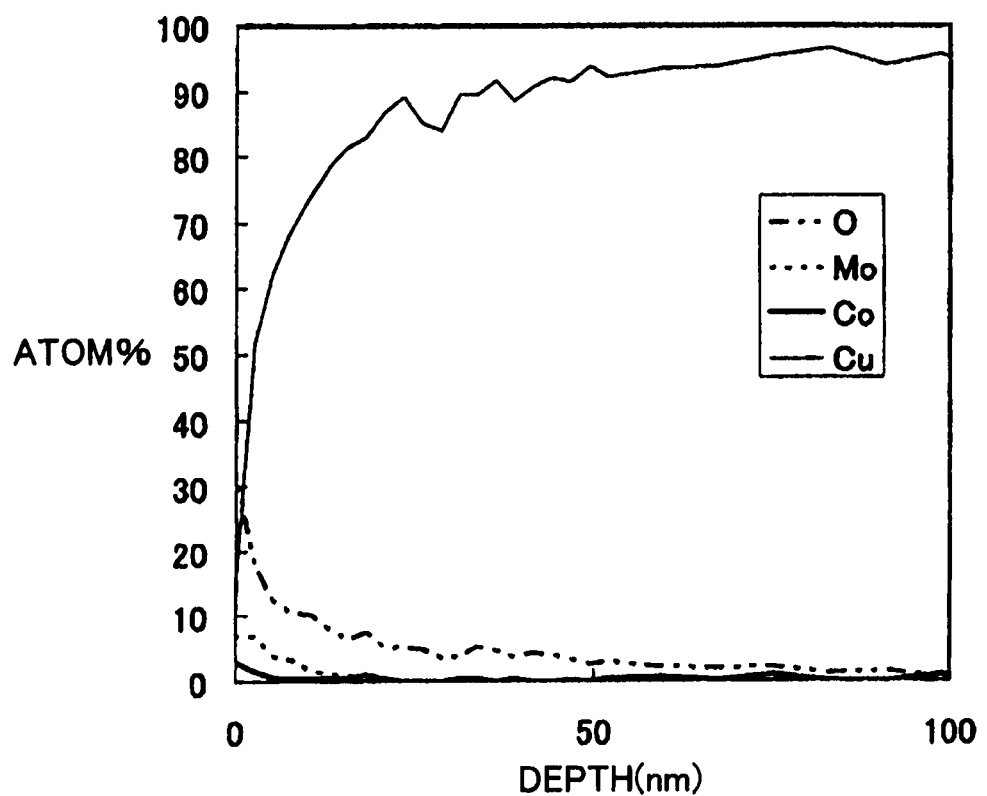
[FIG. 4] A graph showing an element distribution of a peeling interface on the ultra-thin copper foil side in an embodiment of the present invention.

As an example of the results of that, the result of analysis of the ultra-thin copper foil side in the depth direction analysis is shown in FIG. 4.

In the result of analysis of the ultra-thin copper foil side, the element ratio of the metal A and the element ratio of the metal B at the surface are defined as x and y (%), and measurement results of those are shown in Table 2.

Further, in the analysis of the carrier foil side and ultra-thin copper foil side, the maximum value of the element ratio of the metal A from the surface to the internal portion is found, thicknesses up to the depth where the ratio becomes a half of that value are defined as the remaining thicknesses of the release layers, these are indicated by d1 and d2, and measurement results of those are shown in Table 2.

TABLE 2

| No. | Element | | Element ratio (atom %) | | | Remaining thickness of release layer (nm) | | |
| --- | --- | --- | --- | --- | --- | --- | --- | --- |
| | Metal A | Metal B | x | y | y/(x + y) × 100 | d1 | d2 | d1/d2 |
| Example 1 | Mo | Co | 6.8 | 2.9 | 29.9 | 12.1 | 2.2 | 5.5 |
| Example 2 | Mo | Co | 6.1 | 0.69 | 10.1 | 12.5 | 1.6 | 7.8 |
| Example 3 | Mo | Co | 6.4 | 1.5 | 19.0 | 12.3 | 1.9 | 6.5 |
| Example 4 | Mo | Co | 2.5 | 3.9 | 60.1 | 10.9 | 2.6 | 4.2 |
| Example 5 | Mo | Co | 1.2 | 4.4 | 78.6 | 10.4 | 3.8 | 2.7 |
| Example 6 | Mo | Co | 3.9 | 3.5 | 47.3 | 8.3 | 4.6 | 1.8 |
| Example 7 | Mo | Co | 7.3 | 2.4 | 24.7 | 12.6 | 1.3 | 9.9 |
| Example 8 | Mo | Co | 6.6 | 1.7 | 21.1 | 13.0 | 1.1 | 11.8 |
| Example 9 | Mo | Co | 6.5 | 3.1 | 32.3 | 11.7 | 2.1 | 5.6 |
| Example 10 | Mo | Co | 6.4 | 2.7 | 29.7 | 12.2 | 2.0 | 6.1 |
| Example 11 | Mo | Ni | 6.7 | 2.8 | 29.5 | 12.3 | 1.9 | 6.5 |
| Example 12 | W | Ni | 7.0 | 2.5 | 26.3 | 12.1 | 2.3 | 5.3 |
| Example 13 | Mo | Co | 6.8 | 2.9 | 29.9 | 12.0 | 2.2 | 5.5 |
| Conventional Example 1 | Mo | Co | 3.3 | 3.2 | 48.9 | 15.5 | 0.9 | 17.2 |
| Comparative Example 1 | Mo | Co | 4.6 | 0.12 | 2.6 | 12.6 | 1.2 | 10.5 |
| Comparative Example 2 | Mo | Co | 5.9 | 0.32 | 5.1 | 12.4 | 1.3 | 9.5 |
| Comparative Example 3 | Mo | Co | 0.63 | 4.7 | 88.2 | 8.9 | 4.7 | 1.9 |
| Comparative Example 4 | Mo | Co | 6.5 | 1.2 | 15.6 | 13.4 | 0.89 | 15.1 |
| Comparative Example 5 | Mo | Co | 6.1 | 0.86 | 12.4 | 14.8 | 0.81 | 18.3 |

TABLE 3

| No. | Number of release layers | Oxidation treatment to first release layer | Diffusion prevention layer | Strike plating onto second release layer | Copper plating solution of ultra-thin copper foil |
|---|---|---|---|---|---|
| Example 1 | 2 | No | No | Yes | Condition 3 |
| Example 2 | 2 | No | No | Yes | Condition 3 |
| Example 3 | 2 | No | No | Yes | Condition 3 |
| Example 4 | 2 | No | No | Yes | Condition 3 |
| Example 5 | 2 | No | No | Yes | Condition 3 |
| Example 6 | 2 | No | No | Yes | Condition 3 |
| Example 7 | 2 | No | No | Yes | Condition 3 |
| Example 8 | 2 | No | No | Yes | Condition 3 |
| Example 9 | 2 | Yes | No | Yes | Condition 3 |
| Example 10 | 2 | No | Yes | Yes | Condition 3 |
| Example 11 | 2 | No | No | Yes | Condition 3 |
| Example 12 | 2 | No | No | Yes | Condition 3 |
| Example 13 | 2 | No | No | Yes | Condition 2 |
| Conventional Example 1 | 1 | No | No | Yes | Condition 3 |
| Comparative Example 1 | 2 | No | No | Yes | Condition 3 |
| Comparative Example 2 | 2 | No | No | Yes | Condition 3 |
| Comparative Example 3 | 2 | No | No | Yes | Condition 3 |
| Comparative Example 4 | 2 | No | No | Yes | Condition 3 |
| Comparative Example 5 | 2 | No | No | Yes | Condition 3 |

TABLE 4

| No. | Carrier peel (kN/m) | Number of blisters | Number of pinholes |
|---|---|---|---|
| Example 1 | 0.03 | 0 | 0 |
| Example 2 | 0.01 | 2 | 1 |
| Example 3 | 0.02 | 0 | 0 |
| Example 4 | 0.05 | 0 | 0 |
| Example 5 | 0.09 | 0 | 0 |
| Example 6 | 0.04 | 0 | 0 |
| Example 7 | 0.03 | 0 | 0 |
| Example 8 | 0.01 | 1 | 2 |
| Example 9 | 0.01 | 0 | 0 |
| Example 10 | 0.01 | 0 | 0 |
| Example 11 | 0.02 | 0 | 0 |
| Example 12 | 0.04 | 0 | 0 |
| Example 13 | 0.05 | 0 | 0 |
| Conventional Example 1 | 0.01 | 14 | 8 |
| Comparative Example 1 | 0.007 | 22 | 10 |
| Comparative Example 2 | 0.009 | 11 | 6 |
| Comparative Example 3 | 0.2 | 0 | 0 |
| Comparative Example 4 | 0.008 | 16 | 8 |
| Comparative Example 5 | 0.005 | 33 | 21 |

TABLE 5

| | Carrier peel (kN/m) | | |
|---|---|---|---|
| No. | Heating at 300° C. for 10 min | Heating at 350° C. for 10 min | Heating at 400° C. for 10 min |
| Example 1 | 0.02 | 0.03 | 0.07 |
| Example 2 | 0.005 | 0.01 | 0.03 |
| Example 3 | 0.02 | 0.02 | 0.04 |
| Example 4 | 0.04 | 0.05 | 0.1 |
| Example 5 | 0.07 | 0.09 | 0.13 |
| Example 6 | 0.03 | 0.04 | 0.08 |
| Example 7 | 0.02 | 0.03 | 0.08 |
| Example 8 | 0.01 | 0.01 | 0.04 |
| Example 9 | 0.01 | 0.01 | 0.05 |
| Example 10 | 0.01 | 0.01 | 0.02 |
| Example 11 | 0.02 | 0.02 | 0.05 |
| Example 12 | 0.03 | 0.04 | 0.09 |
| Example 13 | 0.04 | 0.05 | 0.1 |
| Conventional Example 1 | 0.01 | 0.01 | 0.09 |
| Comparative Example 1 | 0.003 | 0.007 | 0.02 |
| Comparative Example 2 | 0.004 | 0.009 | 0.02 |
| Comparative Example 3 | 0.18 | 0.2 | 0.24 |
| Comparative Example 4 | 0.004 | 0.008 | 0.02 |
| Comparative Example 5 | 0.002 | 0.005 | 0.01 |

As apparent from Table 4, Conventional Example 1 in which the release layer is formed by one layer has a low carrier peel, but has many blistering and pinholes, so is not preferred.

Among the ultra-thin copper foils with carriers of the comparative examples, even if the release layer is formed by two layers, in a case where the ratio {y/(x+y)} between the element ratio x of the metal A and element ratio y of the metal B at the peeling surface on the ultra-thin copper foil 1 side when peeling the carrier foil 2 from the ultra-thin copper foil 1 is extremely small (Comparative Examples 1 and 2) and a case where the ratio (d1/d2) of thicknesses d1 and d2 of release layers remaining at the surfaces of the release layer on the carrier foil side and the release layer on the ultra-thin copper foil side is extremely large (Comparative Examples 4 and 5), the peeling strength at the second interface is excessively low, therefore the peeling strength at the interface becomes "second interface<third interface", thereby causing blistering and pinholes, so it is not preferred.

Further, when the ratio {y/(x+y)} is extremely large (Comparative Example 3), although there is no occurrence of blistering or pinholes, the peeling strength at the third interface is excessively high, therefore the peeling strength at the interface is liable to become "second interface<third interface" and the carrier peel to become too high thereby placing this outside the application standard of the present invention.

Contrary to this, in the ultra-thin copper foils with carriers of Examples 1 to 13, the carrier peel is low and blistering and pinholes are few as well. Further, when compared by the presence of diffusion prevention layers (Example 10 and Example 1), as shown in Table 5, the carrier peel is kept low in the one having a diffusion prevention layer, and the heat resistance is improved due to existence of the diffusion prevention layer.

Next, copper-clad laminate boards were prepared.

Surface treated foils obtained by sequentially depositing nickel, zinc, and chromium on the surfaces of the ultra-thin copper foil side of the ultra-thin copper foils with carriers prepared in the examples described before by a general treatment method were prepared. The surface-treated foils were coated with a polyamic acid varnish, stepwise dried so as not cause foaming, then heated at 330° C. for 30 minutes under a nitrogen atmosphere to cause imidization, and thereby 25 μm thick polyimide-based flexible copper-clad laminate boards were prepared.

The carrier foils were peeled off from these polyimide-based flexible copper-clad laminate boards, then the ultra-thin copper foils were patterned by using a dry film resist to prepare printed circuit board substrates.

In these circuit boards, fine patterns of a line pitch L/S=20/20 could be formed while keeping a high peel strength in the interconnect parts, and the linearity of interconnects was good as well. Further, no problem was seen in the insulation reliability either.

By the present invention, as explained above, there can be provided an ultra-thin copper foil with a carrier suppressing occurrence of blistering at the release layer interface without affecting the carrier peel and enabling easy peeling of the carrier foil from the ultra-thin copper foil even under a high temperature environment.

Further, the present invention has the excellent effect that use of the ultra-thin copper foil with a carrier enables provision of a stable production quality copper-clad laminate board or printed circuit board substrate for use as the substrate for a printed circuit board for fine pattern applications, multilayer printed circuit board, chip-on-film-use circuit board, etc.

Reference Signs List 1 ultra-thin copper foil
2 carrier foil
3 first release layer
4 second release layer
5 first interface
6 third interface
7 second interface

The invention claimed is:

1. An ultra-thin copper foil with a carrier comprised of a carrier foil, a release layer, and an ultra-thin copper foil, wherein
   the release layer is formed by a first release layer disposed on the carrier foil side and a second release layer disposed on the ultra-thin copper foil side, there are a first interface between the carrier foil and the first release layer, a second interface between the ultra-thin copper foil and the second release layer, and a third interface between the first release layer and the second release layer,
   the peeling strengths at the interfaces are such that first interface>third interface and second interface>third interface,
   when the thickness of the release layers remaining at the peeling surfaces on the carrier foil side and on the ultra-thin copper foil side when peeling the carrier foil from the ultra-thin copper foil are d1 and d2, $0.5 \leq d1/d2 \leq 12$,
   the first release layer and the second release layer are formed by a metal A retaining a peeling property and a metal B facilitating plating of the ultra-thin copper foil, and
   an element ratio x of the metal A and an element ratio y of the metal B at the peeling surface on the ultra-thin copper foil side when peeling the carrier foil from the ultra-thin copper foil have a ratio of $10 \leq \{(y/(x+y))\} \times 100 \leq 80$ (%).

2. An ultra-thin copper foil with a carrier comprised of a carrier foil, a release layer, and an ultra-thin copper foil, wherein
   the release layer is formed by a first release layer disposed on the carrier foil side and a second release layer disposed on the ultra-thin copper foil side, there are a first interface between the carrier foil and the first release layer, a second interface between the ultra-thin copper foil and the second release layer, and a third interface between the first release layer and the second release layer,
   after the formation of the first release layer, by applying an oxidation treatment to the surface of the first release layer to form an oxide layer and thereafter forming a second release layer on the oxide layer, the third interface is the oxide layer between the first release layer and the second release layer,
   the peeling strengths at the interfaces are such that first interface>third interface and second interface>third interface,
   the first release layer and the second release layer are formed by a metal A retaining a peeling property and a metal B facilitating plating of the ultra-thin copper foil, and
   an element ratio x of the metal A and an element ratio y of the metal B at the peeling surface on the ultra-thin copper foil side when peeling the carrier foil from the ultra-thin copper foil have a ratio of $10 \leq \{(y/(x+y))\} \times 100 \leq 80$ (%).

3. The ultra-thin copper foil with a carrier as set forth in claim 1 or 2, wherein the metal A forming the first release layer and second release layer is at least one metal selected from a group comprising Mo, Ta, V, Mn, W, and Cr, and the metal B is at least one metal selected from a group comprising Fe, Co, and Ni.

4. The ultra-thin copper foil with a carrier as set forth in claim 3, wherein the carrier foil is a Cu or Cu alloy.

5. The ultra-thin copper foil with a carrier as set forth in claim 1 or 2, wherein a sum of metal deposition amounts of the first release layer and second release layer is 0.05 mg/dm2 to 50 mg/dm2.

6. The ultra-thin copper foil with a carrier as set forth in claim 5, wherein the carrier foil is a Cu or Cu alloy.

7. The ultra-thin copper foil with a carrier as set forth in claim 1 or 2, wherein the peeling strength between the carrier foil and the ultra-thin copper foil after heat treatment at 300° C. is within a range of from 0.005 to 0.1 kN/m.

8. The ultra-thin copper foil with a carrier as set forth in claim 7, wherein the carrier foil is a Cu or Cu alloy.

9. The ultra-thin copper foil with a carrier as set forth in claim 1 or 2, wherein a diffusion prevention layer is disposed between the carrier foil and the first release layer and/or between the second release layer and the ultra-thin copper foil.

10. The ultra-thin copper foil with a carrier as set forth in claim 9, wherein the diffusion prevention layer is formed by Fe, Ni, Co, Cr, or an alloy containing these elements.

11. The ultra-thin copper foil with a carrier as set forth in claim 10, wherein the carrier foil is a Cu or Cu alloy.

12. The ultra-thin copper foil with a carrier as set forth in claim 9, wherein the carrier foil is a Cu or Cu alloy.

13. The ultra-thin copper foil with a carrier as set forth in claim 1 or 2, wherein the carrier foil is a Cu or Cu alloy.

14. A copper-clad laminate board formed by stacking the ultra-thin copper foil with a carrier disclosed in claim 1 or 2 on a resin substrate.

15. A copper printed circuit board substrate formed by stacking the ultra-thin copper foil with a carrier disclosed in claim 1 or 2 on a resin substrate.

* * * * *